United States Patent [19]

Standing

[11] 4,196,381
[45] Apr. 1, 1980

[54] LOW-POWER VOLTAGE AND CURRENT DIODE DRIVER

[75] Inventor: Arthur F. Standing, Rockville, Md.

[73] Assignee: Communications Satellite Corporation, Washington, D.C.

[21] Appl. No.: 823,798

[22] Filed: Aug. 11, 1977

[51] Int. Cl.² ............................................. H01P 1/15
[52] U.S. Cl. ................................ 323/23; 307/317 R; 332/29 R
[58] Field of Search ............... 307/317 R; 323/74, 25, 323/23; 333/7 D, 81 R, 81 A; 332/29 R

[56] References Cited

U.S. PATENT DOCUMENTS

| 3,130,326 | 4/1964 | Habisohn | 307/317 R |
| 3,649,935 | 3/1972 | Low et al. | 333/81 R |
| 3,922,570 | 11/1975 | Eguchi et al. | 333/7 D |
| 3,959,750 | 5/1976 | Holt | 333/7 D |

Primary Examiner—A. D. Pellinen
Attorney, Agent, or Firm—Sughrue, Rothwell, Mion, Zinn and Macpeak

[57] ABSTRACT

A low-power voltage and low-power current driver for use with PIN diode phase shifters is disclosed. The driver uses transistors which function as emitter followers for rapid switching of the voltage applied to the PIN diode and as a voltage or current source for the diode bias. The driver provides for separate control of the reverse bias voltage and forward bias current applied to the PIN diode.

6 Claims, 4 Drawing Figures

U.S. Patent    Apr. 1, 1980    4,196,381
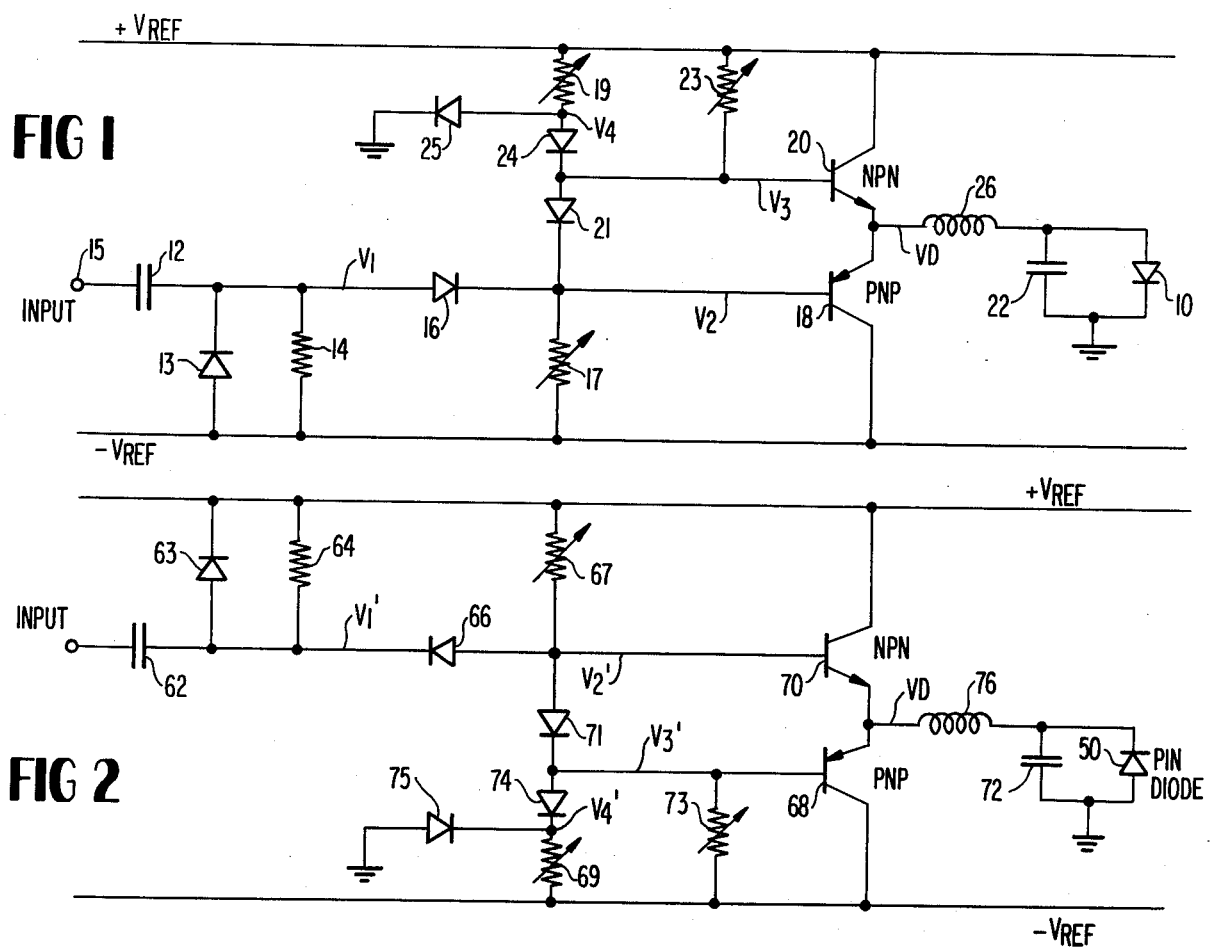
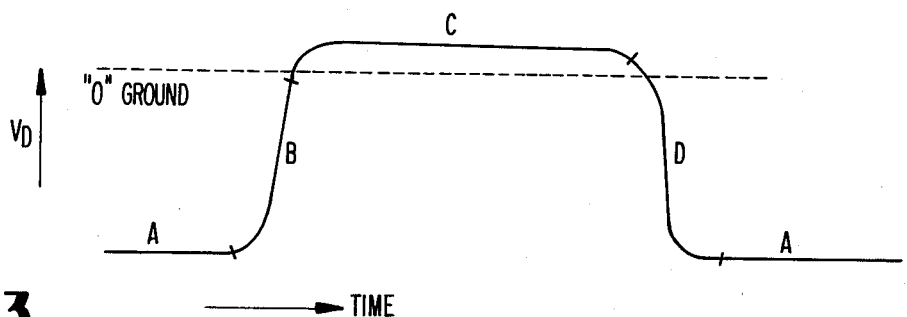
FIG 3
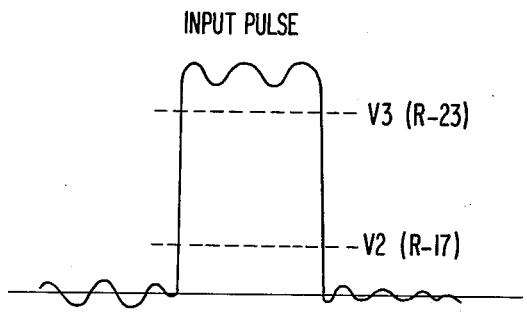
FIG 4

LOW-POWER VOLTAGE AND CURRENT DIODE DRIVER

CROSS REFERENCES

This application relates to an improved low-power voltage and current driver which may be used in PIN diode phase shifters, such as that depicted in my copending application Ser. No. 661,597 now U.S. Pat. No. 4,021,758. This copending application shows a direct modulation 4 phase PSK modulator which uses PIN diodes which are made conducting and non-conducting with a bias supplied from a PIN diode switch control. This low-power voltage and current diode driver may be used as the switch control. Further, this invention also relates to my copending application Ser. No. 661,596 now abandoned, which discloses a PIN diode in a strip-line diode package which is capable of high-speed switching. This PIN diode driver may be used as the driver for the diode package because of the high-speed characteristics required.

BACKGROUND OF THE INVENTION

Heretofore PIN diode drivers have been available commercially, but these diode drivers consume large amounts of power and are voltage sources. These drivers are also large and have a large number of component parts. Further, these devices generally lack the switching speed which is required for PIN diode switching used in direct modulation multi-phase PSK modulators.

BRIEF SUMMARY OF THE INVENTION

The invention is especially useful where rapid switching is required and there is a large capacitance associated with the PIN diode circuit which must be overcome during the switching. The driver according to the invention provides for rapid switching across a RF decoupling capacitor. The driver utilizes switched emitter followers which rapidly drive the PIN diode from one state to another and which also supply the values of current and voltage required to maintain the diode in its conducting or non-conducting state. The transistors act as a voltage source during switching. Further, the driver provides for independent adjustment of the current supplied to the PIN diode when it is conducting, and separate independent adjustment of the voltage supplied when the PIN diode is reverse biased and non-conducting. In this way, the PIN diode impedance characteristics are controlled as may be required in a direct modulation multi-phase PSK modulator.

Further, the invention provides drive current and voltage which are independent of input voltage variations.

Further, the invention provides for reliability because a minimum number of components are used.

The invention is an improved voltage and current driver which is useful for driving PIN diodes used in strip-line diode packages and in direct modulation multi-phase PSK modulators. The invention provides a driver which produces the low power and current required for driving a diode in these applications. The maintenance power of the driver of this invention is substantially less than the driver used heretofore.

BRIEF DESCRIPTION OF THE DRAWINGS

FIG. 1 is a schematic diagram of the PIN diode driver circuit which reverse biases the PIN diode when the voltage of the input pulse is low.

FIG. 2 is a schematic diagram of the PIN diode driver circuit which is reversed from that of FIG. 1 in that the PIN diode is conducting when the voltage of the input pulse is low. The PIN diode is also in the opposite direction.

FIG. 3 is a graph showing the voltage across the PIN diode of FIG. 1 with segments of the curve depicting different operational characteristics of the PIN diode driver as an input pulse is applied.

FIG. 4 is a graph showing the input pulse and the relative magnitude of the driver voltages.

DETAILED DESCRIPTION OF THE PREFERRED EMBODIMENTS

Referring now to FIG. 1, one embodiment of the low-power voltage and current diode driver, according to the invention, uses a first driver means, transistor 18, for driving the PIN diode 10 with a reverse bias voltage of the correct sign and magnitude, and a second driver means, transistor 20, for supplying the correct current to the PIN diode 10 when the PIN diode is forward biased. A diode switching circuit consisting of diodes 16, 21, 24 and 25 is used to control the bias currents and voltages applied to transistors 18 and 20. The diode switching circuit is responsive to an input pulse and switches the biases and base currents which control the drivers. Associated with the diode switching circuit are control variable resistors 17, 19 and 23 which adjust the diode switching circuit threshold and the bias for the transistors 18 and 20.

In FIG. 1, the input may be either connected directly to the anode of diode 16 or to capacitor 12, which, along with diode 13 and resistor 14, forms a D.C. restorer or D.C. clamp. The capacitor 12, resistor 14 and the cathode of diode 13 are connected to the anode of diode 16 to form a D.C. clamp.

The cathode of diode 16 is connected to the cathode of diode 21, to the base of transistor 18 and to resistor 17. The transistor driver 18 has its collector connected to the negative reference voltage, its base connected to the cathode of diode 16 and its emitter connected to the RF decoupling coil 26.

Diode 21 has its cathode connected to the cathode of diode 16 and its anode connected to the cathode of diode 24, to resistor 23 and to the base of transistor driver 20. Transistor driver 20 has its collector connected to the positive reference source, its base connected to the anode of diode 21 and its emitter connected to the inductor 26. Resistor 23 is connected to the positive reference source and to the base of transistor driver 20. Resistor 19 is also connected to the positive reference source, to the anode of diode 25, and to the anode of diode 24. The cathode of diode 25 is connected to ground, and the cathode of diode 24 is connected to the base of transistor 20.

The PIN diode 10 is shown with its cathode connected to ground and with the RF decoupling capacitor 22 in parallel with it. The capacitor 22 represents the PIN diode capacitance and the decoupling capacitance of the PIN diode circuit. The inductor 26 is connected to the emitters of transistors 18 and 20 and to the PIN diode anode. The combination of inductor 26 and capacitor 22 is a radio frequency filter.

In FIG. 1, there is shown a voltage and current driver which reverse biases the PIN diode 10 when the input voltage is low. The D.C. restorer or D.C. clamp stage consists of capacitor 12, diode 13 and resistor 14. An input pulse is applied to capacitor 12 at terminal 15. A voltage V1 appears at the junction of capacitor 12 and resistor 14 and is applied to diode 16. This D.C. level shift provided by capacitor 12, diode 13 and resistor 14 is not required if the input pulse applied to capacitor 12 has sufficient D.C. voltage offset to open circuit the diode 16.

In the quiescent condition, this circuit is adjustable by adjustment of resistors 17 and 19 which set voltage V2. When voltage V1 is less than voltage V2, diode 16 will be reverse biased and non-conducting. This allows V2 to control transistor 18. When diode 16 is non-conducting, voltage V2 will forward bias transistor 18 which will produce, at its output, a voltage VD which is $$VD = -V_{REF} + V2 + 0.7$$

where +0.7 is the emitter-base voltage of transistor 18 and $-V_{REF}$ is the negative reference voltage. At this time, transistor 18 operates as an emitter follower. The output voltage VD is then applied to the PIN diode 10. This reverse biases and cuts off PIN diode 10. This condition is indicated in FIG. 3 as the curve portion A where VD is negative, and the PIN diode 10 is non-conducting. Further, transistor 20 is non-conducting because the voltage at its base V3 is $$V3 = -V2 + 0.7$$

where 0.7 is the voltage across diode 21. In this state, diode 21 provides a balance for the emitter base voltage of transistor 20 which keeps the emitter and base of transistor 20 at the same potential. This keeps transistor 20 turned off.

As the input voltage V1 rises, it will exceed V2 and diode 16 will become forward biased and will start to conduct. This causes the base of transistor 18 to rise and causes transistor 18 to cease conducting. Further, as the voltage V2 increases with the input voltage pulse, the voltage V3 at the base of transistor 20 becomes greater than the voltage VD and transistor 20 begins to conduct. Transistor 20 then functions as an emitter follower and drives the voltage VD in the opposite direction, overcoming the charge stored in capacitor 22. During this transition, the base voltage of transistor 20 is controlled by voltage V3 which is controlled by V1. This condition is represented by FIG. 3 as the curve portion B.

Voltage V4 will rise as voltage V3 increases. Further, when V2 rises and becomes greater than V3, diode 21 will be reverse biased and will be non-conducting.

When diode 21 is cut off, voltage V3 will be greater than the voltage V4, and diode 24 will be non-conducting. This is possible because diode 25 will be forward biased and conducting, thereby reducing V4 to +0.7 volts.

The non-conduction of diode 24 and diode 21 allows the base of transistor 20 to be controlled by resistor 23 only. When transistor 20 is under the control of resistor 23 connected to its base, transistor 20 becomes a current source which is independent of the setting of resistor 19. In FIG. 3, this condition is depicted in the curve portion C.

As the input voltage pulse drops, diode 16 becomes reverse biased and will cease conducting when its input reaches the voltage V2. This causes resistor 17 to control the bias of diode 21, and diode 21 will be forward biased and conducting. This will cause the voltage V3 to drop, diode 24 to conduct and diode 25 become non-conducting. Transistor 18 operates as an emitter follower during this switching period, and this gives a fast fall time. In this manner, transistor 18 is turned on and the reverse bias on the PIN diode is once again established. FIG. 3 shows the turning on of diodes 21 and 24 in the curve portion marked as D.

In FIG. 1, resistors 17 and 19 are used to adjust the voltage applied to the PIN diode 10 when it is reverse biased. Further, the voltage V2 which is set by resistor 19 is a threshold voltage which must be exceeded in order to cause switching of the diodes 16, 21, 24 and 25. Further, control of the current through PIN diode 10, when it is forward biased, is a function of the current through resistor 23 which controls the base current of transistor 20. In this manner, the PIN diode driver provides for control independent of ripple or uneven voltage which might appear at the top of the control pulse or at its lower value. The input pulse serves only to control the diode switching circuit, and any ripple or variance at either the low- or high-pulse state will not appear in the output of the transistors 18 and 20.

In FIG. 2, resistors 69 and 67 are used to control the reverse bias voltage applied to the PIN diode 50 and to set the threshold voltage. Resistor 73 is used to control the current supplied to the PIN diode 50 by control of the current supplied to the base of transistor 68.

In FIG. 2, there is shown the PIN diode control which is used to control the PIN diode 50. The polarity of PIN diode 50 is reversed from PIN diode 10 of FIG. 1. When the input voltage is high, diode 66 is reverse biased and non-conducting. The voltage V2' is controlled by resistors 67 and 69. The diodes 71 and 74 are forward biased and conducting. This, in turn, turns transistor 70 on and reverse biases the PIN diode 50 and makes it non-conducting.

When the input voltage V1' is low, diode 66 will conduct and the input voltage will appear at the base of transistor 70 as voltage V2'. This will, in turn, cut off diodes 71 and 74 and will turn on diode 75. Transistor 70 will be turned off, and transistor 68 will be turned on. When transistor 68 is on, it is controlled by resistor 73 and will produce an output which is negative. This will forward bias the PIN diode 50 and will make it conducting. The capacitor 72 and the inductor 76 are equivalent to capacitor 22 and inductor 26 in FIG. 1, respectively. The direction of the PIN diode polarity is reversed, the anode being connected to ground.

In FIG. 4, the input pulse is shown with the magnitudes of V2 and V3 of FIG. 1. As can be seen, any variance of the low or high voltage of the pulse will not affect the output because the actual bias of transistors 18 and 20 is not a function of the input pulse magnitude. The bias voltage and current are functions of the voltage established on resistors 17 and 23 by the diode switching circuit.

What is claimed is:

1. A low power voltage/current PIN diode driver having an input and an output comprising in combination:

a first driver means connected to said output for supplying a voltage to said PIN diode for reverse bias;

a second driver means connected to said output for supplying a current to said PIN diode for forward bias;

a diode switching circuit connected to said first and said second driver means and to said input and responsive to an input pulse controlled voltage level for switching said first and second drivers wherein said diode switching circuit comprises:

means for operating the first driver means as an emitter follower when the voltage level is lesser than or equal to a first preselected value and for operating the first driver means as a voltage source when the voltage level exceeds said first preselected value;

means for operating the second driver means as an emitter follower when the voltage level is greater than or equal to a second preselected value and for operating the second driver as a constant current source when the voltage level exceeds said second preselected value.

2. The low power voltage/current PIN diode driver of claim 1 wherein said first and second driver means are transistors.

3. The low power voltage/current PIN diode driver of claim 2 wherein said diode switching circuit includes:

a first diode connected to the base of said first driver means transistor and to said input;

a second diode connected to the base of said first driver means transistor and to the base of said second driver means transistor;

a third diode connected to ground, and having an output; and a fourth diode having an input connected to said third diode output and to the base of said second driver means transistor.

4. The low power voltage/current PIN diode driver of claim 3 wherein said diode switching circuit includes:

a first adjustable resistor connected to said third diode output and to said fourth diode input for controlling the voltage supplied to the first driver means; and a second adjustable resistor connected to said base of said second driver means transistor and to a reference potential for controlling the current supplied to the second driver means.

5. A low power voltage/current diode driver having an input and an output for driving a PIN diode circuit comprising in combination:

a first driver (18) transistor having an emitter connected to said PIN diode circuit, a collector connected to a first polarity reference potential and having a base;

a second driver (20) transistor having an emitter connected to said PIN diode circuit, a collector connected to a second polarity reference potential and having a base;

a first diode (16) having a first terminal connected to said first driver transistor base and a second terminal connected to said input;

a second diode (21) having a first terminal connected to said second driver transistor base and having a second terminal connected to said first driver transistor base;

a third diode (24) having a first terminal connected to said second transistor base and having a second terminal;

a fourth diode (25) having a first terminal connected to a first source of reference potential and to said third diode second terminal and having a second terminal connected to ground;

a first adjustable resistor (19) having a first terminal connected to said second polarity reference potential and having a second terminal connected to said third diode second terminal and said fourth diode first terminal for controlling the voltage applied to said first transistor driver base for controlling said first transistor output voltage; and a second adjustable resistor (23) having a first terminal connected to said second polarity reference potential and having a second terminal connected to said second transistor driver base for controlling the current supplied to said second transistor driver base for controlling said second transistor output current.

6. The low power voltage/current PIN diode driver of claim 5, wherein the current supplied by said second driver when acting as a constant current source is adjustable independently of the input pulse amplitude.

* * * * *